(12) United States Patent
Bhattacharyya et al.

(10) Patent No.: US 7,193,259 B2
(45) Date of Patent: Mar. 20, 2007

(54) THERMALLY WRITTEN MAGNETIC MEMORY DEVICE

(75) Inventors: Manoj K. Bhattacharyya, Cupertino, CA (US); Thomas C. Anthony, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 58 days.

(21) Appl. No.: 10/898,279

(22) Filed: Jul. 23, 2004

(65) Prior Publication Data

US 2006/0017126 A1    Jan. 26, 2006

(51) Int. Cl.
*H01L 31/072*    (2006.01)
(52) U.S. Cl. .................................. 257/295
(58) Field of Classification Search ............. 257/295
See application file for complete search history.

(56) References Cited

U.S. PATENT DOCUMENTS

2006/0083056 A1* 4/2006 Daughton et al. .......... 365/158

OTHER PUBLICATIONS

Jorg F Loffler, et al; Random and exchange anisotropy in consolidated nanostructured Fe and Ni: Role of grain size and trace oxides on the magnetic properties; Physical Review B, vol. 57, No. 5, Feb. 1, 1998.
Z. Celinski, et al; Exchange Biasing in Ferromagnet/antiferromagnet Fe/KMnF3; Rec'd Sep. 18, 1998; rec'd revised form Feb. 15, 1999; Journal of Magnetism and Magnetic Material 202 (1999) 480-484.
O. De Haas, et al; Rotational Magnetization Processes in Exchange Biased; www.sciencedirect.com; Journal of Magnetism and Magnetic Materials 260 (2003) 380-385.

* cited by examiner

*Primary Examiner*—Long Pham

(57) ABSTRACT

A thermally written magnetic memory device is disclosed. The thermally written magnetic memory device includes a plurality of thermally written magnetic tunnel junction devices. Each thermally written magnetic tunnel junction device includes a super-paramagnetically stable data layer. The data layer includes a high coercivity at a read temperature such that a bit of data previously written to the data layer at a higher write temperature can be read from the data layer at the read temperature. The data layer has a low coercivity at the higher write temperature and data is written to the data layer at the higher write temperature. Therefore, at the lower read temperature, the thermally written magnetic memory device is a read only non-volatile memory and the data stored therein can be read many times but new data cannot be written to the data layer at the read temperature.

15 Claims, 11 Drawing Sheets

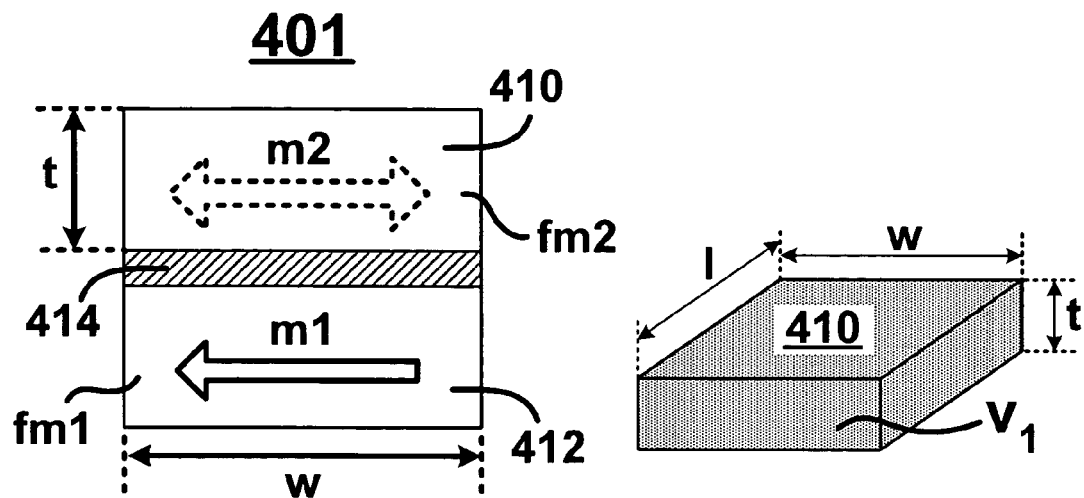
FIG. 1a (Prior Art)
FIG. 1d (Prior Art)
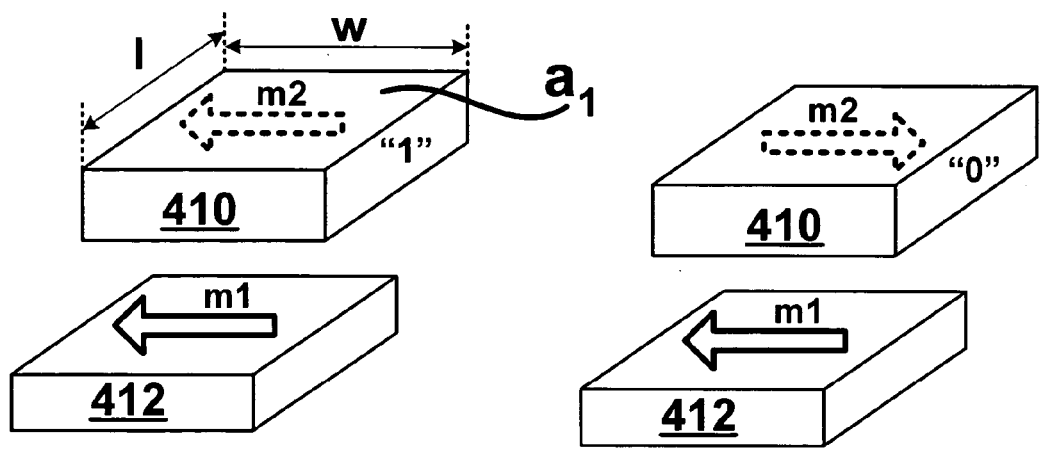
FIG. 1b (Prior Art)
FIG. 1c (Prior Art)
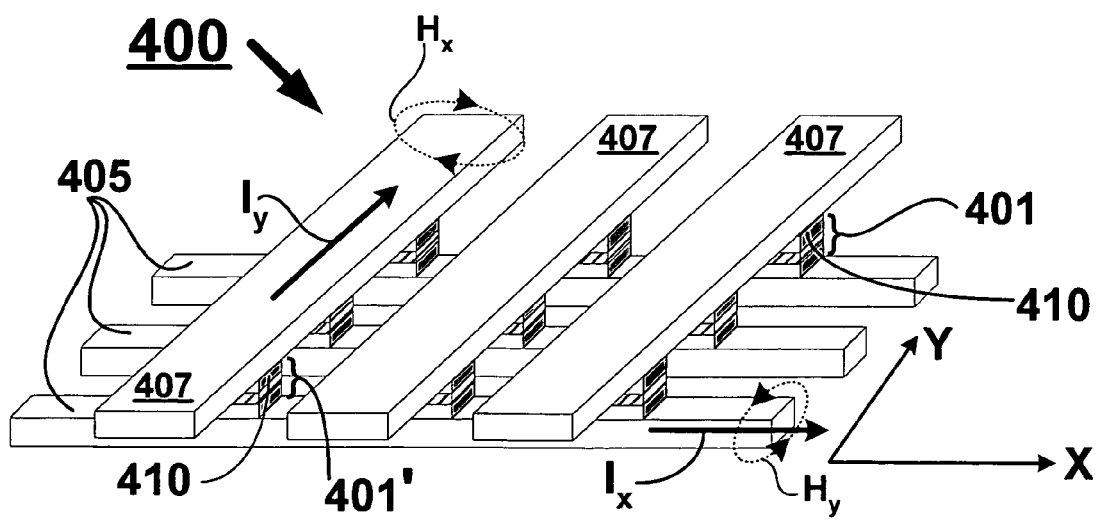
FIG. 2 (Prior Art)

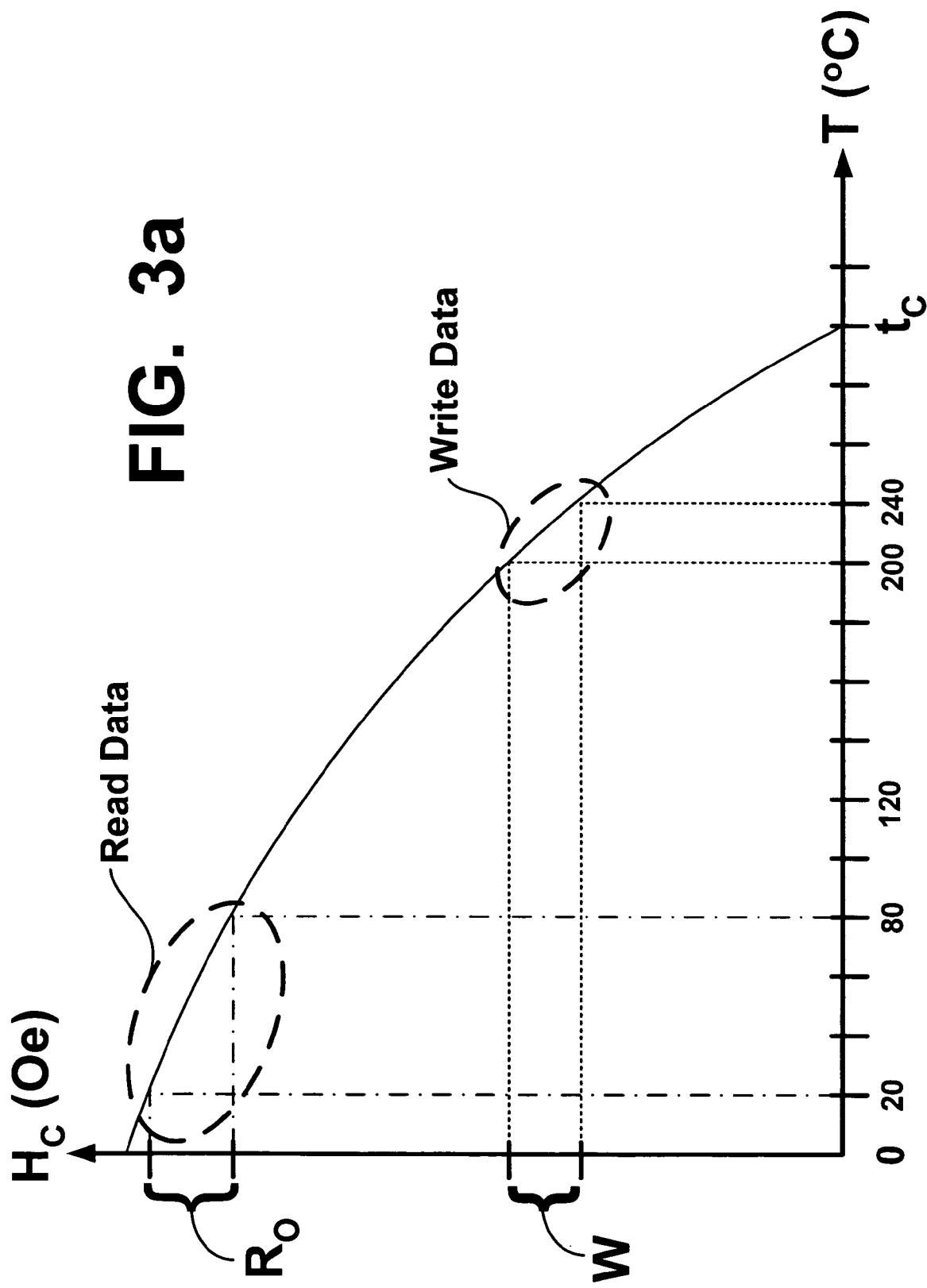

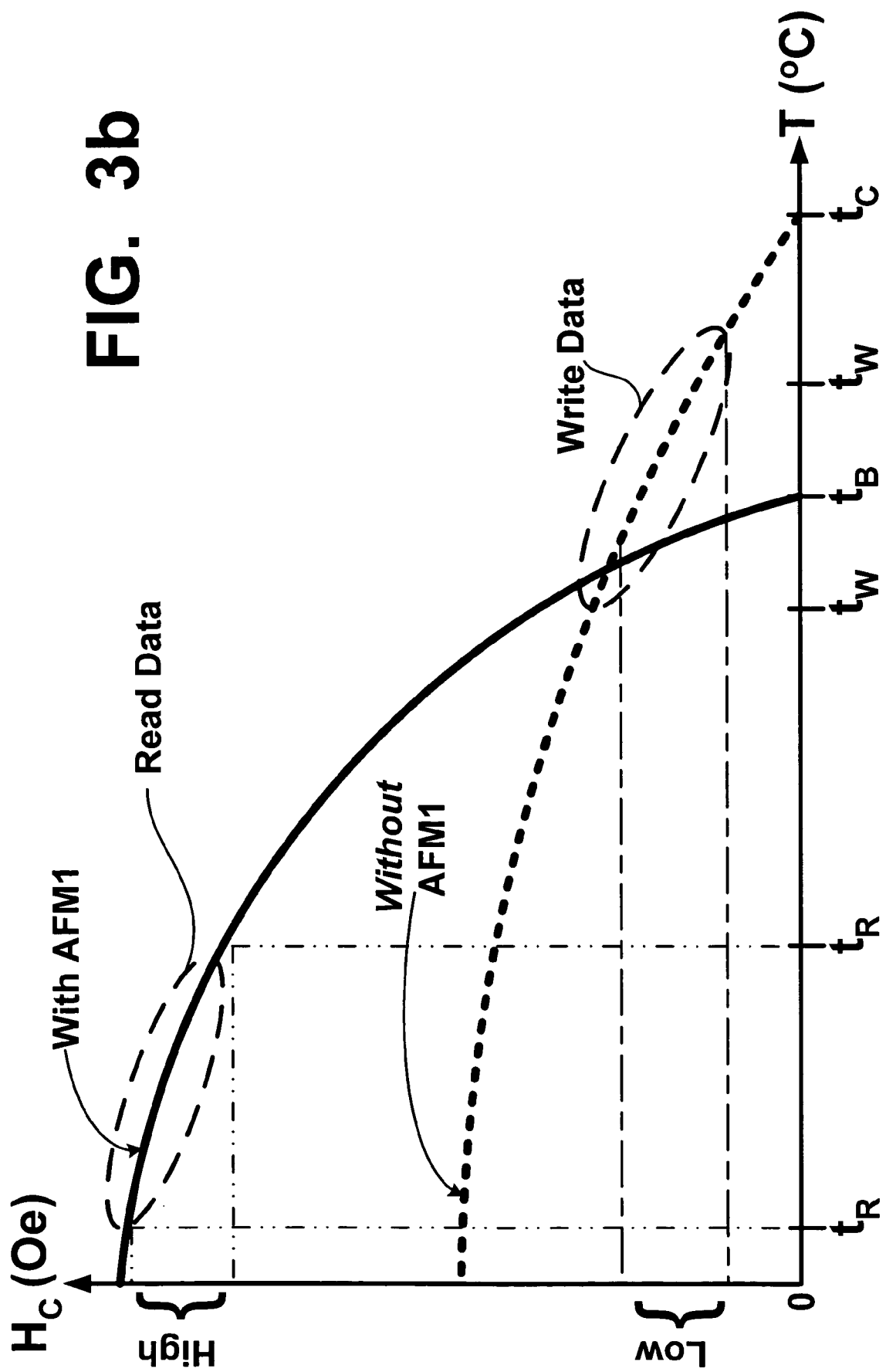

THERMALLY WRITTEN MAGNETIC MEMORY DEVICE

FIELD OF THE INVENTION

The present invention relates generally to a thermally written magnetic memory device that includes a data layer wherein the data stored therein is read only and non-volatile at a read temperature and data can be written to the data layer at a write temperature. More specifically, the present invention relates to a thermally written magnetic memory device including a plurality of super-paramagnetically stable data layers with a high coercivity at a read temperature where data can be read from the data layers and a low coercivity at a higher write temperature where data can be written to the data layers.

BACKGROUND OF THE ART

Magnetic Random Access Memory (MRAM) is an emerging technology that can provide an alternative to traditional data storage technologies such as hard disc drives, optical data storage media, RAM, DRAM, and FLASH memory, just to name a few. MRAM has desirable properties including fast access times like DRAM and high areal storage densities like hard disc drives. MRAM stores a bit of data (i.e. information) as an alterable orientation of magnetization in a patterned thin film magnetic element that is referred to as a data layer, a sense layer, a storage layer, or a data film. The data layer is designed so that it has two stable and distinct magnetic states that define a binary one ("1") and a binary zero ("0"). Although the bit of data is stored in the data layer, many layers of carefully controlled magnetic and dielectric thin film materials are required to form a complete magnetic memory element. One prominent form of magnetic memory element is a spin tunneling device. The physics of spin tunneling is complex and good literature exists on the subject of spin tunneling.

In FIG. 1a, a prior magnetic tunnel junction device 401 includes a spacer layer 414 that separates a data layer 410 from a reference layer 412 (also referred to as a pinned layer). If the spacer layer 414 is made from a dielectric material (e.g. aluminum oxide $Al_2O_3$) then the device 401 is a tunneling magnetoresistance device (TMR). On the other hand, if the spacer layer 414 is made from an electrically conductive material (e.g. copper Cu), then the device 401 is a giant magnetoresistance device (GMR). The data layer 410 is made from a ferromagnetic material fm2, such as nickel-iron (NiFe), for example. The reference layer 412 is also made from a ferromagnetic material fm1, such as cobalt-iron (CoFe), for example. The reference layer 412 has a pinned orientation of magnetization m1, that is, the pinned orientation of magnetization m1 is fixed in a predetermined direction and does not rotate in response to an external magnetic field. In contrast, the data layer 410 has an alterable orientation of magnetization m2 that can rotate between two orientations in response to an external magnetic field.

As an example, in FIG. 1b, when the pinned orientation of magnetization m1 and the alterable orientation of magnetization m2 point in the same direction (i.e. they are parallel to each other) the data layer 410 stores a binary one ("1"). On the other hand, in FIG. 1c, when the pinned orientation of magnetization m1 and the alterable orientation of magnetization m2 point in opposite directions (i.e. they are anti-parallel to each other) the data layer 410 stores a binary zero ("0").

In FIG. 2, a prior MRAM device 400 includes a plurality of the magnetic tunnel junction devices 401 arranged in an array (e.g. a cross-point array) and positioned at an intersection between a plurality of column conductors 407 and row conductors 405 that are in electrical communication with the data and references layers (410, 412). In order for the MRAM device 400 to have a data storage density on par with other established data storage devices, such as hard disc drives and semiconductor memories, it is necessary to pack as many of the devices 401 as is possible in the array. To that end, in FIG. 1b, an area a, of the data layer 410 is made as small as possible by making a width w and a length l of the data layer 410 as small as possible (i.e. $a_1 = w*l$). By reducing the area $a_1$, an areal density of the MRAM device 400 is increased and the data storage density is increased. In FIG. 1d, because the layers of material in the magnetic tunnel junction device 401 are very thin (e.g. from about 30 Å to about 50 Å for the data layer 410), a volume $v_1$ as defined by a nominal thickness t of the data layer 410 and the area $a_1$ is also very small (i.e. $v_1 = a_1*t$).

However, one disadvantage arises from the high storage densities that are required to compete with well established data storage technologies. Namely, super-paramagnetism related reversal of the alterable orientation of magnetization m2. The reversal is due to the volume $v_1$ being small, which results in a small magnetic volume for the data layer 410. When the magnetic volume is small, the anisotropy energy that holds the alterable orientation of magnetization m2 in a stable state is also small. Consequently, thermal noise/temperature fluctuations can flip the alterable orientation of magnetization m2 resulting in corrupted data being stored in the data layer 410.

Moreover, in FIG. 2, another disadvantage arises during a write operation to the MRAM device 400. A write current $l_x$ flowing through the row conductor 405 and a write current $l_y$ flowing through the column conductor 407 generate magnetic fields $H_y$ and $H_x$ respectively. Those magnetic fields cooperatively interact with the data layer 410 of a selected magnetic tunnel junction device 401' and flip the alterable orientation of magnetization m2 of the selected device 401'. However, those magnetic fields ($H_y$, $H_x$) also interact with adjacent magnetic tunnel junction devices 401 in the array. Consequently, the aforementioned small anisotropy energy can cause the alterable orientation of magnetization m2 of adjacent data layers 410 to flip due to stray magnetic fields, thereby corrupting the data stored in adjacent data layers 410.

Consequently, there is a need for a magnetic tunnel junction memory device that includes a data layer that is super-paramagnetically stable and the data is non-volatile and immune to data corruption caused by thermal noise, temperature fluctuations, and/or stray magnetic fields.

SUMMARY OF THE INVENTION

The thermally written magnetic memory device of the present invention solves the aforementioned problems. The device includes a plurality of thermally written tunnel junction devices. A data layer of each thermally written tunnel junction device has a high coercivity at a read temperature and is super-paramagnetically stable at the read temperature. Consequently, data stored in the data layer is non-volatile at the read temperature and is immune to data corruption caused by stray magnetic fields, thermal noise, and temperature fluctuations. The data layer has a low coercivity at a write temperature that is higher than the read temperature. The data layers in the plurality of thermally written tunnel junction devices are heated to the write temperature where a coercivity of the data layer is at the low coercivity and data can be written to one or more of the data layers. The data layers can be actively or passively cooled down to the read temperature where the coercivity of the data layers is at the high coercivity and the data previously written to the data layers at the write temperature can be read from the data layer but cannot be written to the data layer at the lower read temperature.

In one embodiment, each thermally written tunnel junction device includes an antiferromagnetic pinning layer that is in contact with the data layer. The antiferromagnetic pinning layer pins the alterable orientation of magnetization of the data layer when the data layer is at the read temperature where the coercivity of the data layer is at the high coercivity. Consequently, the data layer is super-paramagnetically stable at the read temperature and the data is non-volatile at the read temperature.

In another embodiment, each thermally written tunnel junction device includes a data layer with a width dimension of the data layer that is smaller than a length dimension of the data layer so that a shape anisotropy of the data layer is sufficiently large enough to make the data layer super-paramagnetically stable at the read temperature. The shape anisotropy results in a data layer with a high coercivity at the read temperature so that the data is non-volatile at the read temperature.

In yet another embodiment, each thermally written tunnel junction device includes a data layer with a thickness selected to make a volume of the data layer sufficiently large enough to increase a magnetic volume of the data layer so that the data layer is super-paramagnetically stable and has a high coercivity at a read temperature so that the data is non-volatile at the read temperature.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 1a is a cross-sectional view depicting a prior magnetic tunnel junction device.

FIGS. 1b and 1c are profile views depicting data storage in a data layer of a prior magnetic tunnel junction device.

FIG. 1d is a profile view depicting a small magnetic volume of a thin data layer of a prior magnetic tunnel junction device.

FIG. 2 is a profile view depicting a prior MRAM device that includes an array of the prior magnetic tunnel junction devices.

FIG. 3a is a graph depicting a relationship between coercivity and temperature for reading data from and writing data to a super-paramagnetically stable data layer.

FIG. 3b is a graph depicting an exchange anisotropy of a data layer coupled with an antiferromagnetic pinning layer and an exchange anisotropy of a data layer that is not coupled with an antiferromagnetic pinning layer.

DETAILED DESCRIPTION

Figure 4:
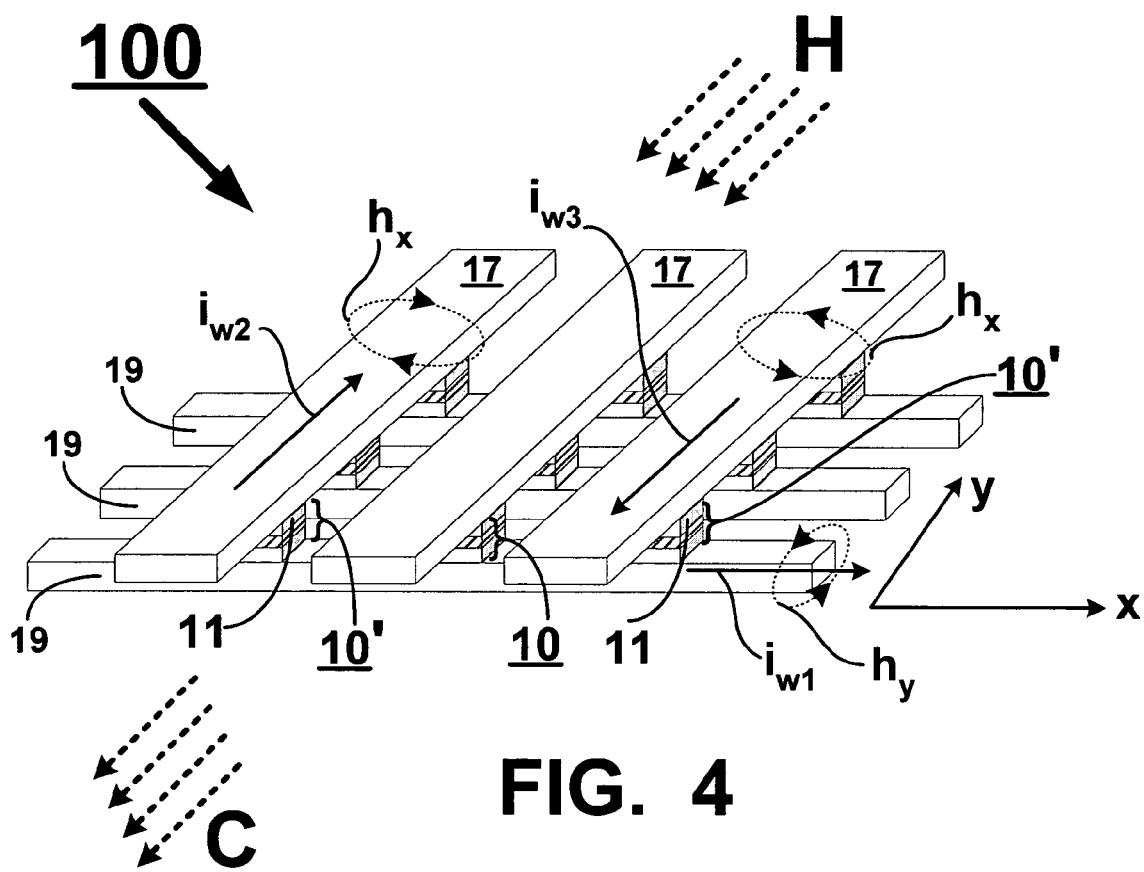
FIG. 4 is a profile view depicting a thermally written magnetic memory device that includes a plurality of thermally written tunnel junction devices.

In the following detailed description and in the several figures of the drawings, like elements are identified with like reference numerals.

As shown in the drawings for purpose of illustration, the present invention is embodied in a thermally written magnetic memory device. The thermally written magnetic memory device includes a plurality of first and second electrodes and a plurality of thermally written tunnel junction devices. Each thermally written tunnel junction device includes a reference layer in electrical communication with one of the first electrodes, a data layer in electrical communication with one of the second electrodes, and a spacer layer in contact with the reference layer and the data layer.

The data layer is super-paramagnetically stable at a read temperature and has a high coercivity at the read temperature. Data stored in the data layer can be read from the data layer when the data layer is at the read temperature; however, data cannot be written to the data layer when the data layer is at the read temperature. The data layer has a low coercivity at a write temperature that is higher than the read temperature. Data can be written to the data layers by heating the plurality of thermally written tunnel junction devices to the write temperature and then selecting one or more of the data layers for a write operation. When the data layers cool to the read temperature, where their coercivity is high, the data layers are super-paramagnetically stable and the thermally written magnetic memory device is non-volatile and can be operated as a read-only memory.

In FIG. 4, a thermally written magnetic memory device 100 includes a plurality of first electrodes 19, a plurality of second electrodes 17, and a plurality of thermally written tunnel junction devices 10. The thermally written tunnel junction device 10 may be positioned between an intersection of one of the first electrodes 19 with one of the second electrodes 17. The first and second electrodes (19, 17) can be arranged in an array wherein the first electrodes 19 are arranged in rows and the second electrodes 17 are arranged in columns, or vice-versa. The structure depicted in FIG. 4 is an example only and the thermally written tunnel junction device 10 need not be positioned intermediate between the first and second electrodes (19, 17) and the first and second electrodes need not be arranged in rows and columns.

Figure 5A:
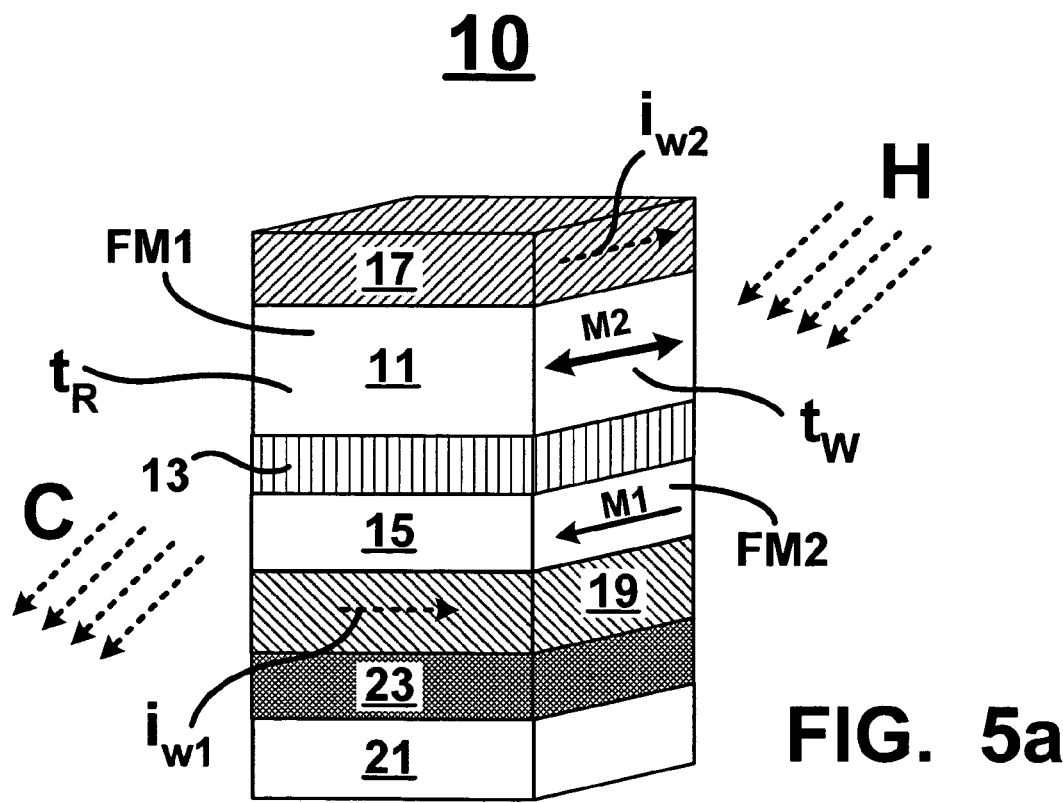
FIGS. 5a and 5b are a profile view and a cross-sectional view respectively and depict a thermally written magnetic tunnel junction device with a super-paramagnetically stable data layer.

In FIG. 5a, each of the thermally written tunnel junction device 10 includes a reference layer 15 including a pinned orientation of magnetization M1, a data layer 11 including an alterable orientation of magnetization M2 operative to store a bit of data (data hereinafter) as one of two possible magnetic orientations that are either parallel or anti-parallel to the pinned orientation of magnetization M1, and a spacer layer 13 in contact with the reference layer 15 and the data layer 11. The reference layer 15 is in electrical communication with one of the first electrodes 19 and the data layer 11 is in electrical communication with one of the second electrodes 17. The data layer 11 is made from a first ferromagnetic material FM1 and the reference layer 15 is made from a second ferromagnetic material FM2. The ferromagnetic materials (FM1, FM2) are well understood in the tunnel junction art and can include but are not limited to combinations of nickel (Ni), iron (Fe), cobalt (Co), and alloys of those materials, just to name a few. The spacer layer 13 can be made from a dielectric material including but not limited to aluminum oxide ($Al_2O_3$) for a TMR device or an electrically conductive material including but not limited to copper (Cu) for a GMR device. As an example, the second ferromagnetic material FM2 for the reference layer 15 can include a multi-layered thin film stack such as NiFe, CoFe, or CoFe:Ru:CoFe; whereas, the first ferromagnetic material FM1 for the data layer 11 can include an alloy of NiFe or NiCoFe.

Figure 5B:
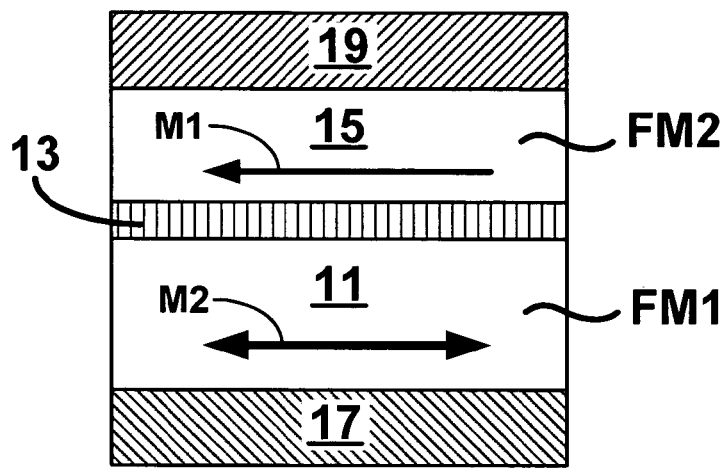

In FIG. 5b, one or ordinary skill in the tunnel junction art will appreciate that the order of the thin layers of material that comprise a portion of a tunnel junction stack can include an order the reverse of that depicted for the thermally written tunnel junction devices 10 in FIG. 5a. For example, the second electrode 17 and the data layer 11 can be positioned at a bottom of the tunnel junction stack and the first electrode 19 and the reference layer 15 can be positioned at a top of the tunnel junction stack.

As is well understood in the microelectronics art, the data layer 11 and the reference layer 15 are made from a ferromagnetic material and may be made from one or more layers of material that vary depending on a topology of the tunnel junction device 10. Other thin film layers of material such as cap layers, buffer layers, and seed layers may be included in the thermally written tunnel junction devices 10 and their use will depend on the topology of the tunnel junction device 10. One of ordinary skill in the microelectronics art will also appreciate that the thermally written magnetic tunnel junction device 10 can be fabricated on a substrate 21 (see FIG. 5a), such as a silicon (Si) substrate, for example, and that the data layer 11 can be positioned above or below the spacer layer 13 as depicted in FIGS. 5a and 5b respectively. The thermally written magnetic tunnel junction device 10 can also include a layer of a dielectric material 23 in contact with the substrate 21 and the electrodes (17, 19), or one of the other layers of material in the tunnel junction stack. For example, the dielectric material can be a layer of silicon oxide ($SiO_2$) or silicon nitride ($Si_3N_4$).

A coercivity $H_c$ of the data layer 11 is high at a read temperature $t_R$ and the data layer 11 is super-paramagnetically stable at the read temperature $t_R$. Data stored in the data layer 11 can be read from the data layer 11 at the read temperature $t_R$. However, data cannot be written to the data layer 11 at the read temperature $t_R$. Consequently, the data layers 11 in the thermally written magnetic memory device 100 are read-only at the read temperature $t_R$. Therefore, the thermally written magnetic memory device 100 comprises a non-volatile read-only memory at the read temperature $t_R$.

A coercivity $H_c$ of the data layer 11 is low at a write temperature $t_W$. The write temperature $t_W$ is higher than the read temperature $t_R$ (i.e. $t_W > t_R$). Data is written to the data layers 11 by heating H the plurality of thermally written tunnel junction devices 10 to the write temperature $t_W$ and then writing data to one or more selected thermally written tunnel junction devices 10 (see selected devices 10' in FIG. 4). For example, by passing a write current $i_{W1}$ through the first electrode 19 and write currents $i_{W2}$ and $i_{W3}$ through the second electrodes 17, the data layers 11 of the thermally written tunnel junction devices 10' are selected for a write operation. A magnetic field $h_y$ generated by the write current $i_{W1}$ cooperatively interacts with a magnetic fields $h_x$ generated by the write currents $i_{W2}$ and $i_{W3}$ to flip the alterable orientation of magnetization M2 in the data layers 11 of the selected devices 10'. At the read temperature $t_R$ and at the write temperature $t_W$, the pinned orientation of magnetization M1 of the reference layer 15 remains pinned in its fixed direction (i.e. it does not flip or rotate) and is not affected by magnetic fields generated by the aforementioned write currents.

As will be described below, the heating H to the write temperature $t_W$ can include using a heat source to heat the data layers 11 of the plurality of thermally written tunnel junction devices 10 until the data layers 11 reach the write temperature $t_W$. When the write temperature $t_W$ is reached, data can be written to one or more of the selected data layers 11 in the memory device 100 as described above in reference to FIG. 4.

After the heating H is terminated, the plurality of thermally written tunnel junction devices 10 can be actively or passively cooled down to the read temperature $t_R$. Passive cooling can include allowing the thermally written magnetic memory device 100 to naturally cool down to an ambient temperature such as a room temperature (e.g. about 25° C.) or to an operating temperature of the device 100. As will be described below, active cooling can include using a cooling source for cooling C the data layers 11 of the plurality of thermally written tunnel junction devices 10 to the read temperature $t_R$.

In FIG. 3a, a graph of a coercivity $H_c$ of the fist ferromagnetic material FM1 of the data layer 11 on a Y-axis versus a temperature T of the first ferromagnetic material FM1 on a X-axis depicts a relationship between coercivity and temperature for a ferromagnetic material. At a relatively low temperature (i.e. on a left side of the temperature axis T) the coercivity $H_c$ is high. On the other hand, at a relatively high temperature (i.e. on a right side of the temperature axis T) the coercivity $H_c$ is low. Consequently, at the relatively low temperature (i.e. relative to a higher write temperature) the data layer 11 has a high coercivity in a "Read Data" region denoted by a dashed oval. The low temperature is a range of read temperatures $t_R$ at which data can be read from but not written to the data layer 11.

The high coercivity at the read temperature $t_R$ will be application dependent and will depend in part on the first ferromagnetic material FM1 selected for the data layer 11, a volume of the data layer 11 (e.g. a thickness of the data layer 11), the dimensions of the data layer 11, and a topology of the thermally written tunnel junction devices 10, as will be described below. At the read temperature $t_R$, the data layer 11 is super-paramagnetically stable and the data stored therein is substantially immune to the aforementioned problems associated with thermal noise, temperature fluctuations, and stray magnetic fields.

Accordingly, when the coercivity $H_c$ is high, the data layer 11 is effectively a read only data layer in which data previously written to the data layer 11 during a previous write operation is non-volatile and can be read from the data layer 11. Therefore, for a range of read temperatures $t_R$, the coercivity $H_c$ of the data layer 11 is high as denoted by a read only region $R_o$ along the coercivity axis $H_c$. However, due to the high coercivity, data cannot be written to the data layer 11 while the data layer 11 is at the read temperature $t_R$.

The read temperature $t_R$ will also be application dependent. For example, it is desirable for an ambient operating temperature of the thermally written magnetic memory device 100 to be within the "Read Data" region of read temperatures $t_R$ so that the data can be read from the data layer 11. The operating temperature should not be so high that the data layers 11 in the thermally written magnetic memory device 100 are at the write temperature $t_W$. Preferably, the read temperature $t_R$ is less than about 125° C. More preferably, the read temperature is in a range from about 20° C. to about 80° C. That range includes a room temperature of about 25° C. and an operating temperature that is typical inside an enclosure of an electronic device or system, such as a PC, a laptop computer, or other portable electronic devices for example.

On a right side of the temperature axis T in FIG. 3a, at a temperature T that is higher than the read temperature $t_R$, the data layers 11 have a lower coercivity on the coercivity axis $H_c$. The higher temperature is denoted as a write temperature $t_W$. The reduced coercivity of the data layers 11 at the write temperature $t_W$ enables data to be written to the data layers 11 by electrode current as was described above in reference to FIG. 4. The lower coercivity at the write temperature $t_W$ will be application specific and will depend in part on the first ferromagnetic material FM1 selected for the data layer 11 and a Curie temperature $t_C$ of the first ferromagnetic material FM1. As an example, the low coercivity of the data layer 11 at the write temperature $t_W$ can be in a range from about 10 Oersteds to about 50 Oersteds.

It is important that the write temperature $t_W$ be within a range that is below the Curie temperature $t_C$ of the first ferromagnetic material FM1 because at the Curie temperature $t_C$, the coercivity $H_c$ of the data layer 11 is zero. As an example, the write temperature can be in a range from about 200° C. to about 240° C. It is also important that the write temperature $t_W$ not be so high as to damage the thermally written magnetic memory device 100 and/or the thermally written tunnel junction devices 10.

As indicated in FIG. 3a, a temperature dependent coercivity $H_c$ of the data layer 11 is essential to realize a high coercivity at the read temperature $t_R$ and a low coercivity at the write temperature $t_W$. Two general examples for producing a temperature dependent coercivity include: 1) a temperature dependence of a magnetization in ferromagnetic films that gives rise to the Curie temperature $t_C$; and 2) the temperature dependence of an exchange anisotropy between coupled ferromagnetic and antiferromagnetic films. Those two examples are intended to be illustrative, and other structures and mechanisms may produce the desired temperature dependence.

In the first example, the Curie temperature $t_C$ is an important indicator of a magnitude of change in coercivity $H_c$ to be expected between the read temperature $t_R$ and the write temperature $t_W$. At the Curie temperature $t_C$, ferromagnetic order in the first ferromagnetic material FM1 disappears. Consequently, both the magnetization and the coercivity $H_c$ (which is proportional to the magnetization in a patterned single-domain ferromagnetic film) are zero at the Curie temperature $t_C$. If the Curie temperature $t_C$ is too far above the desired write temperature $t_W$, then a coercivity differential between the read $t_R$ and write $t_W$ temperatures may be insufficient. Hence, the Curie temperature $t_C$ should be taken under consideration when selecting the first ferromagnetic material FM1 for the data layer 11.

Bulk Curie temperatures $t_C$ of NiFe and CoFe, two ferromagnetic materials commonly used as data layers in MRAM devices, are above 500° C. However, the Curie temperature $t_C$ of films less than about 10 nm in thickness can be significantly reduced compared to the bulk value of the Curie temperature $t_C$. In addition, alloys with lower Curie temperatures $t_C$, may be employed as the data layer 11.

In the second example, many ferromagnetic materials used in MRAM have Curie temperatures $t_C$ that are too large to provide the desired coercivity change between the read temperature $t_R$ and the write temperature $t_W$. By coupling the ferromagnetic material of the data layer 11 to an antiferromagnetic layer to form an exchange couple, the temperature dependence of a magnetic anisotropy (and coercivity $H_c$) is governed by a combination of the ferromagnetic material anisotropy and an exchange anisotropy between the ferromagnetic layer and the antiferromagnetic layer. The magnitudes and temperature dependencies of the anisotropies can be adjusted independently through judicious choice of materials and film thicknesses.

FIG. 3b depicts an example where the exchange anisotropy at the read temperature $t_R$ is very large (i.e. in a "Read Data" region of a curve "With AFM1") for a data layer 11 that is coupled with a first antiferromagnetic pinning layer 12 (also denoted as AFM1 in FIGS. 6a and 6b), whereas the ferromagnetic anisotropy is comparatively low when the data layer 11 is not coupled with the first antiferromagnetic pinning layer 12 as denoted by a curve "Without AFM1". Hence, for a first exchange couple comprising the data layer 11 and the first antiferromagnetic pinning layer 12, the exchange anisotropy dominates at the read temperature $t_R$ and yields a magnetically stable data layer 11 with a high coercivity. The high coercivity and the pinning of the alterable orientation of magnetization M2 result in the data being non-volatile at the read temperature $t_R$.

As the temperature is increased, the exchange anisotropy falls and reaches zero at a blocking temperature $t_B$ of the first exchange couple (11, 12). The blocking temperature $t_B$ will depend on the materials selected for the first exchange couple (11, 12). At or near the blocking temperature $t_B$, the coercivity $H_C$ of the data layer 11 is dictated primarily by the magnetic properties and geometry of the first ferromagnetic material FM1 of the data layer 11 and the effect of the exchange couple between the data layer 11 and the first antiferromagnetic layer 12 is insignificant. Consequently, in the "Write Data" region of the dashed curve "Without AFM1", the exchange anisotropy of the exchange couple (11, 12) is at or near zero, the coercivity $H_C$ of the data layer 11 is low, and the alterable orientation of magnetization M2 is not pinned by the first antiferromagnetic pinning layer 12.

Because the alterable orientation of magnetization M2 is not pinned and the coercivity $H_C$ is low, data can be written to the data layer 11 in a range of write temperatures $t_W$ as depicted in FIG. 3b. The blocking temperature $t_B$ may fall within that range of write temperatures $t_W$. On the other hand, the blocking temperature $t_B$ can be substantially equal to the write temperature $t_W$, less than the write temperature $t_W$, or greater than the write temperature $t_W$. Therefore, in the first exchange couple (11, 12) the temperature dependence of the first antiferromagnetic pinning layer 12, rather than the first ferromagnetic material FM1 of the data layer 11, controls the temperature dependence of the coercivity $H_C$ of the data layer 11.

At the write temperature $t_W$, data can be written to the data layer 11 by passing write currents (see FIGS. 4 and 5a) of sufficient magnitude through the first and second electrodes (19, 17) so that the magnetic fields ($h_x$, $h_y$) generated by those write currents ($i_{W1}$, $i_{W2}$) cooperatively interact with the data layer 11 of a selected device 10' to rotate the alterable orientation of magnetization M2. Accordingly, a heat source as described above, can be used for heating H the data layer 11 to the write temperature $t_W$ to reduce the coercivity $H_C$ to the low coercivity necessary to write data to the data layers 11 as depicted by a dashed oval region denoted as "Write Data" in FIGS. 3a and 3b.

Figure 6A:
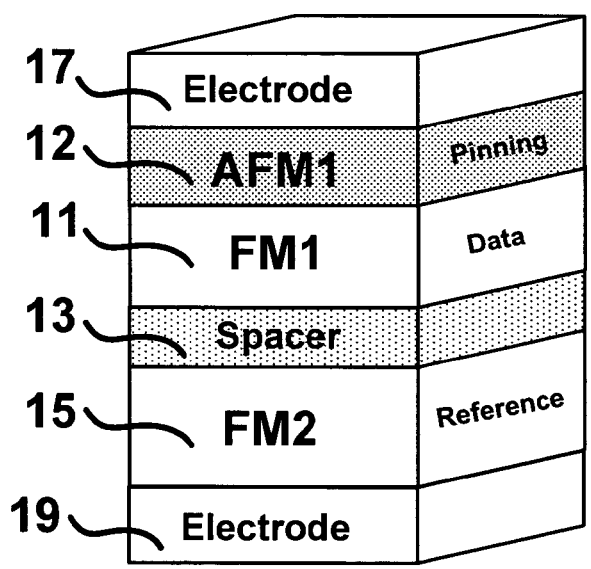
FIGS. 6a through 6e are profile views depicting examples of topologies for a thermally written magnetic tunnel junction device including an anti-ferromagnetic pinning layer in contact with a data layer.
Figure 6B:
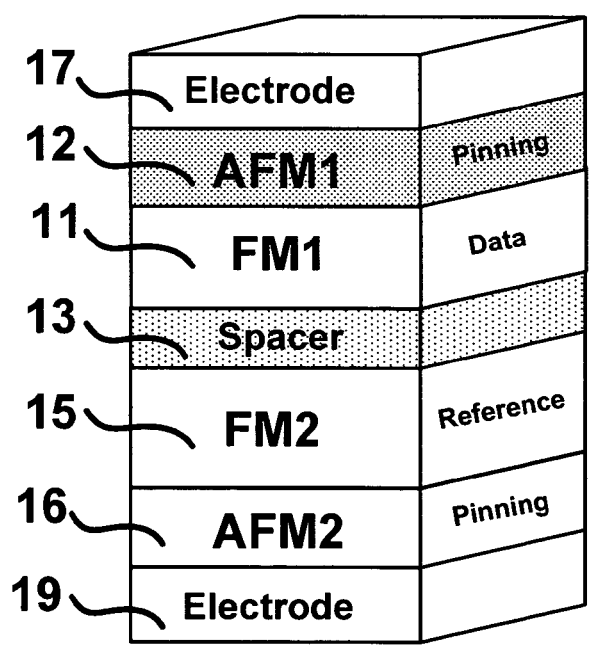

In FIGS. 4 and 6a, a thermally written magnetic memory device 100 includes a plurality of first electrodes 19, a plurality of second electrodes 17, and a plurality of thermally written tunnel junction devices 10. Each of the thermally written tunnel junction devices 10 includes a reference layer 15 in electrical communication with one of the first electrodes and including a pinned orientation of magnetization M1 and a first exchange couple comprising a first antiferromagnetic pinning layer 12 (also denoted as AFM1) in contact with a data layer 11. The data layer 11 is in electrical communication with one of the second electrodes 17 and includes an alterable orientation of magnetization M2 for storing data. A spacer layer 13 is in contact with the data layer 11 and the reference layer 15. The first antiferromagnetic pinning layer 12 is operative to pin the alterable orientation of magnetization M2 when the data layer 11 is at the read temperature $t_R$ where the coercivity $H_C$ of the data layer 11 is at the high coercivity. Moreover, the first antiferromagnetic pinning layer 12 pins (i.e. couples with) the alterable orientation of magnetization M2 so that a magnetic anisotropy K of the data layer is increased at the read temperature $t_R$ and the alterable orientation of magnetization M2 cannot rotate (i.e. flip) in response to magnetic fields, thermal noise, or temperature fluctuations. As a result, the data layer 11 is super-paramagnetically stable at the read temperature $t_R$ and data previously written to the data layer 11 at the write temperature $t_W$ can be read from but not written to the data layer 11 at the read temperature $t_R$.

Figure 6C:
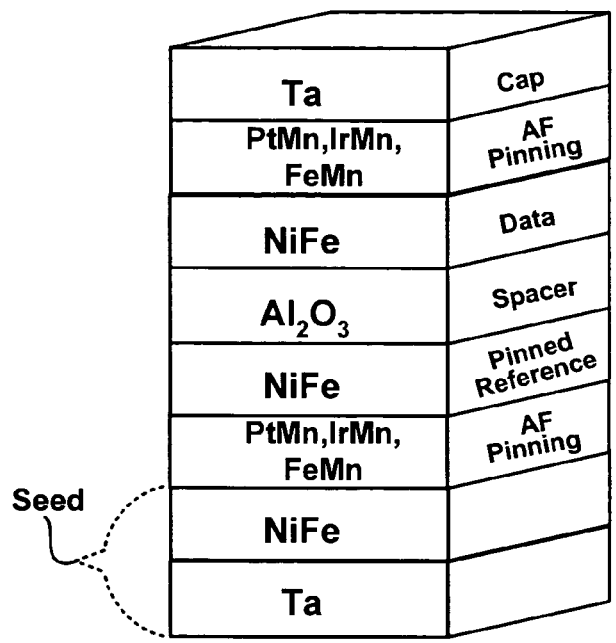
Figure 6D:
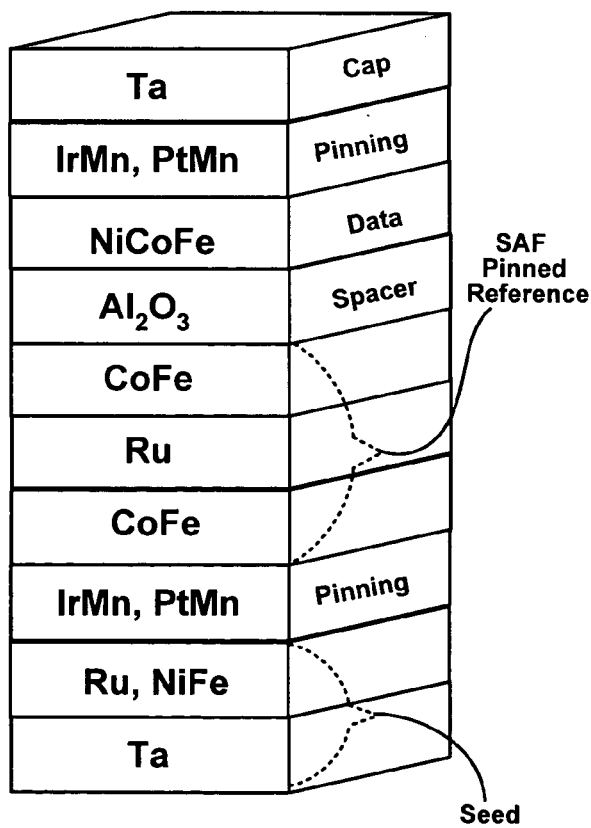
Figure 6E:
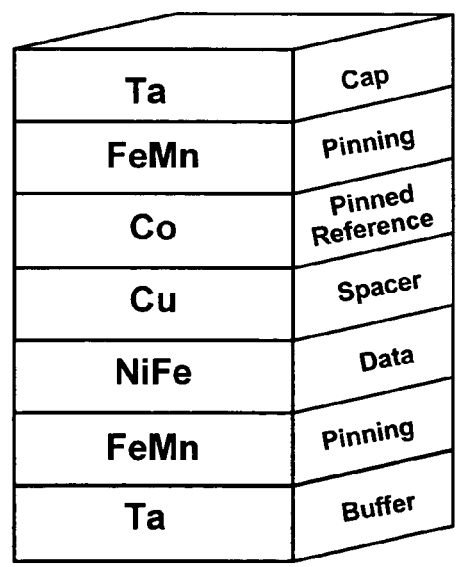

As is well understood in the tunnel junction art, the reference layer 15 is typically connected with a pinning film that pins the orientation of magnetization M1. Accordingly, in FIG. 6b, the thermally written tunnel junction devices 10 can include a second exchange couple comprising a second antiferromagnetic pinning layer 16 (also denoted as AFM2) in contact with the reference layer 15. In FIGS. 6c through 6e, examples of topologies of the thermally written tunnel junction devices 10 are depicted. Suitable materials for the first and second antiferromagnetic pinning layers (AFM1, AFM2) include but are not limited to IrMn, PtMn, and MnFe. As an example, PtMn is an exemplary material for the first antiferromagnetic pinning layer AFM1 because PtMn exhibits a large exchange anisotropy and has a high blocking temperature $t_B$. The reference layer 15 can be made from one or more layers of material such as CoFe:Ru:CoFe. Other layers in the tunnel junction stack can include but are not limited to seed layers, cap layers, and buffer layers.

The materials for the second antiferromagnetic pinning layer 16 and the reference layer 15 can be selected so that a blocking temperature $t_B$ of the second exchange couple (15, 16) is greater than the blocking temperature $t_B$ of the first exchange couple (11, 12) and/or is greater than the write temperature $t_W$. By carefully selecting the materials for the second exchange couple (15, 16), the exchange anisotropy will dominate at the write temperature $t_W$ and the pinned orientation of magnetization M1 will not be altered when data is written to the data layers 11 of the thermally written tunnel junction devices 10.

Figure 7A:
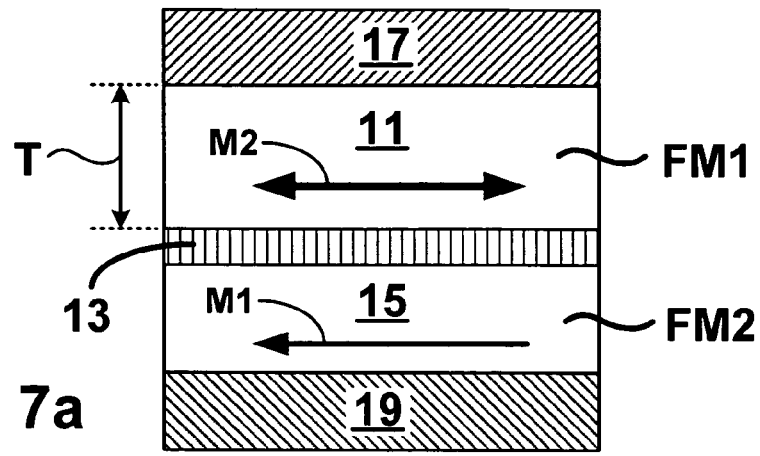
FIGS. 7a and 7b are cross-sectional views depicting a thermally written magnetic tunnel junction device with a thickness dimension of a data layer increased to increase a magnetic volume of the data layer.

In FIGS. 4 and 7a, a thermally written magnetic memory device 100 includes a plurality of first electrodes 19, a plurality of second electrodes 17, and a plurality of thermally written tunnel junction devices 10. Each of thermally written tunnel junction devices 10 includes a reference layer 15 in electrical communication with one of the first electrodes and including a pinned orientation of magnetization M1 and a data layer 11 in electrical communication with one of the second electrodes 17 and including an alterable orientation of magnetization M2 for storing data. A spacer layer 13 is in contact with the data layer 11 and the reference layer 15.

Figure 7B:
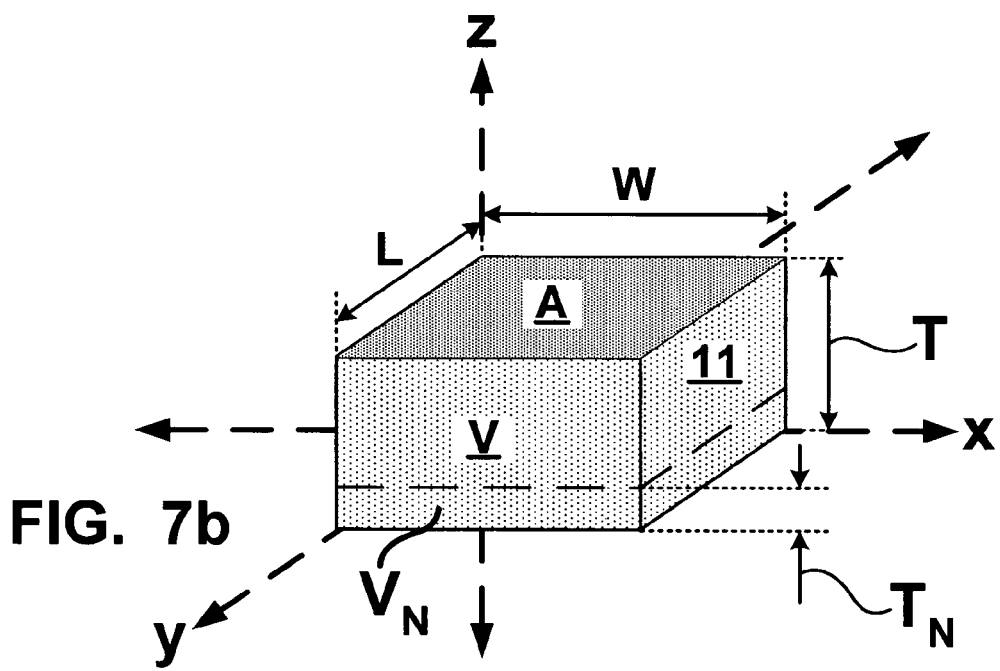
Figure 7C:
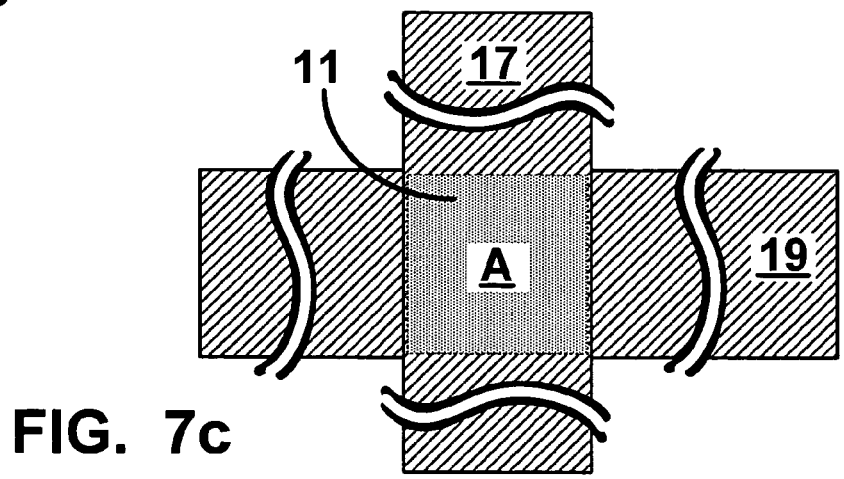
FIG. 7c is a top plan view depicting an area of a data layer that is substantially defined by an intersecting area of a first electrode and a second electrode.

A super-paramagnetically stable data layer can be realized by increasing a magnetic volume of the data layer 11. In FIG. 7a, the high coercivity of the data layers 11 at the read temperature $t_R$ can be obtained by increasing a volume V of the data layer 11 so that the data layer 11 has the high coercivity at the read temperature $t_W$. The volume V can be increased by increasing one or more dimensions of the data layer 11 (e.g. width, length, and/or thickness). Preferably, a thickness T of the data layer 11 is increased to increase the volume V. In FIG. 7b, dimensions of the data layer 11 include a width W, a length L, and a thickness T. Accordingly, an area A of the data layer 11 is determined by a product of the width W and the length L (i.e. A=W*L). Because an areal density of the thermally written magnetic memory device 100 that includes the plurality of the thermally written magnetic tunnel junction devices 10 would be determined by the area A, for high density data storage it is desirable for A to be as small as is possible. Even though the volume V can be increased by increasing any one or more of the dimensions W, L, and T, it is preferable that the thickness T be increased so that the area A of the data layer 11 is not increased resulting in a concomitant decrease in areal density. As one example, an areal density of the thermally written magnetic memory device 100 can be determined by the area A defined by a cross-sectional area created by an intersection of the first electrodes 19 with the second electrodes 17 (see FIG. 7c) in a cross-point array where the thermally written magnetic tunnel junction devices 10 are positioned at the intersection between the electrodes (17, 19).

Turning now to FIG. 7b, a nominal volume $V_N$ of a data layer is substantially determined by the area A and a nominal thickness $T_N$ (i.e. $V_N = A*T_N$), where the nominal thickness $T_N$ would typically be in a range from about 3.0 nm to about 6.0 nm for a prior tunnel junction device. In contrast, the thickness T for the data layer 11 is preferably about two times to about ten times the nominal thickness $T_n$ (i.e. 2× to 10×) so that the increase in the volume V is sufficiently large enough to increase a magnetic volume of the data layer 11 so that the data layer is super-paramagnetically stable and has the high coercivity at the read temperature $t_R$ and the low coercivity at the write temperature $t_W$. As an example, the thickness T can be in a range from about 8.0 nm to about 40 nm. In this thickness range the temperature dependence of coercivity $H_C$ is largely determined by the temperature dependence of the bulk material of the first ferromagnetic material FM1 of the data layer 11.

Figure 8A:
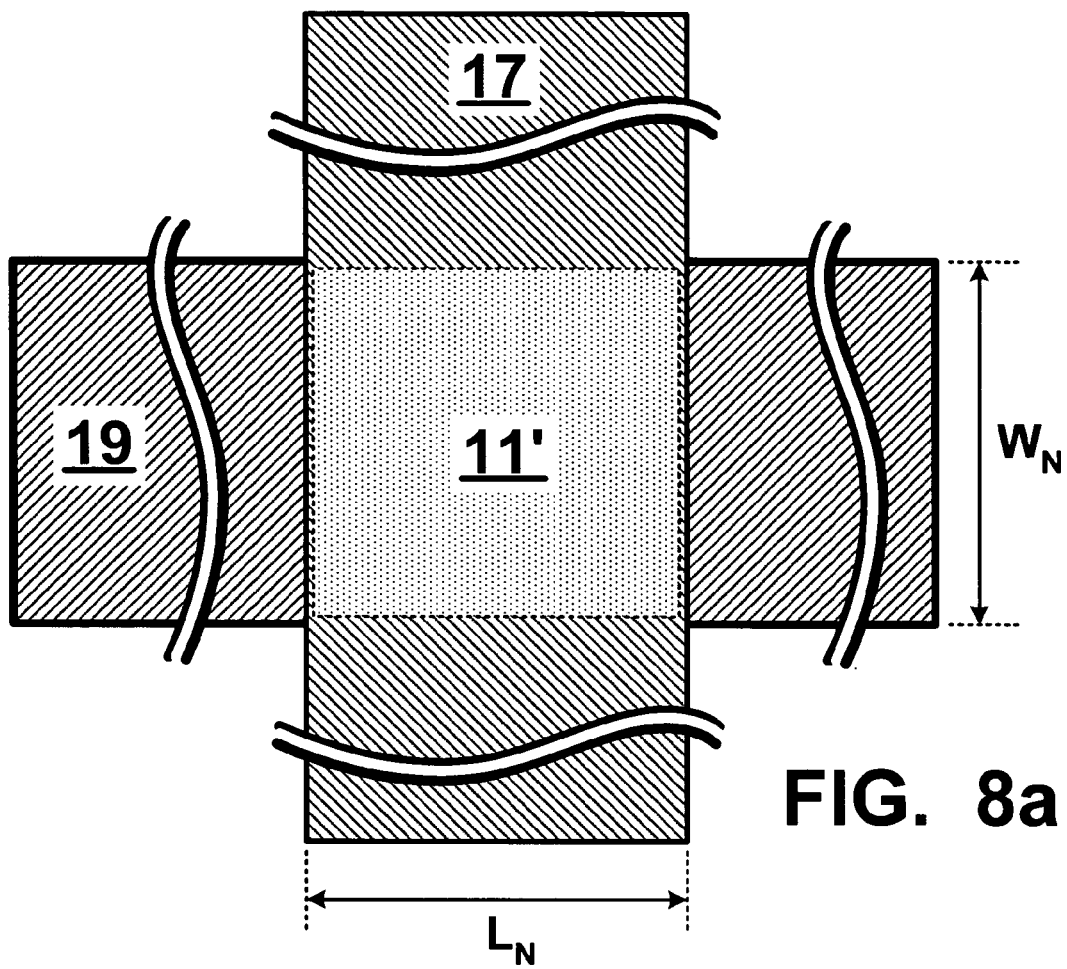
FIG. 8a is a top plan view depicting a nominal width dimension of a data layer.

In FIG. 8a, the data layer 11' includes an aspect ratio that can be determined primarily by the dimensions of the first and second electrodes (19, 17). For example in a cross-point memory array were the thermally written tunnel junction devices 10 are positioned at an intersection of the first and second electrodes (19, 17), if the first and second electrodes (19, 17) have dimensions that are substantially identical, then a width of the first electrode 19 will determine a nominal width $W_N$ Of the data layer 11' and a width of the second electrode 17 will determine a nominal length $L_N$ of the data layer 11'. Accordingly, the aspect ratio ($L_N \div W_N$) of the data layer 11' will be about 1.0 when the widths of the first and second electrodes (19, 17) are substantially identical to each other.

Figure 8B:
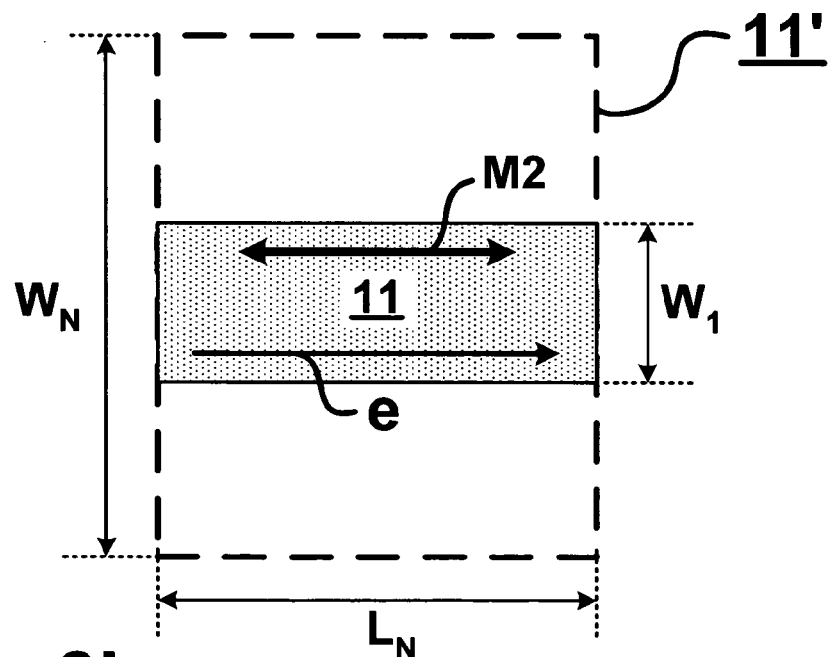
FIGS. 8b and 8c are top plan views depicting a data layer including a reduced width dimension to increase a shape anisotropy of the data layer.

In FIG. 8b, the aspect ratio of the data layer 11 is increased by decreasing the nominal width $W_N$ of the data layer 11 to a narrower width of $W_1$. As a result, a shape anisotropy of the data layer 11 is increased when compared to a smaller aspect ratio of the data layer 11' as depicted by the heavy dashed line in FIG. 8b. Therefore, by decreasing a width dimension of the data layer 11 relative to a length dimension of the data layer 11, the aspect ratio is increased with a concomitant increase in the shape anisotropy. The increased shape anisotropy results in the alterable orientation of magnetization M2 being aligned with an easy axis e of the data layer 11. The actual value for the aspect ratio will be application specific. As one example, the aspect ratio can be increased by reducing the width dimension of the data layer 11 in a range from about 0.2 times smaller than the length dimension of the data layer 11 (e.g. $W_1 \approx 0.2 * L_N$) to about 0.5 times smaller than the length dimension of the data layer 11 (e.g. $W_1 \approx 0.5 * L_N$). That is, the aspect ratio can be in a range from about 2:1 to about 5:1.

Figure 8C:
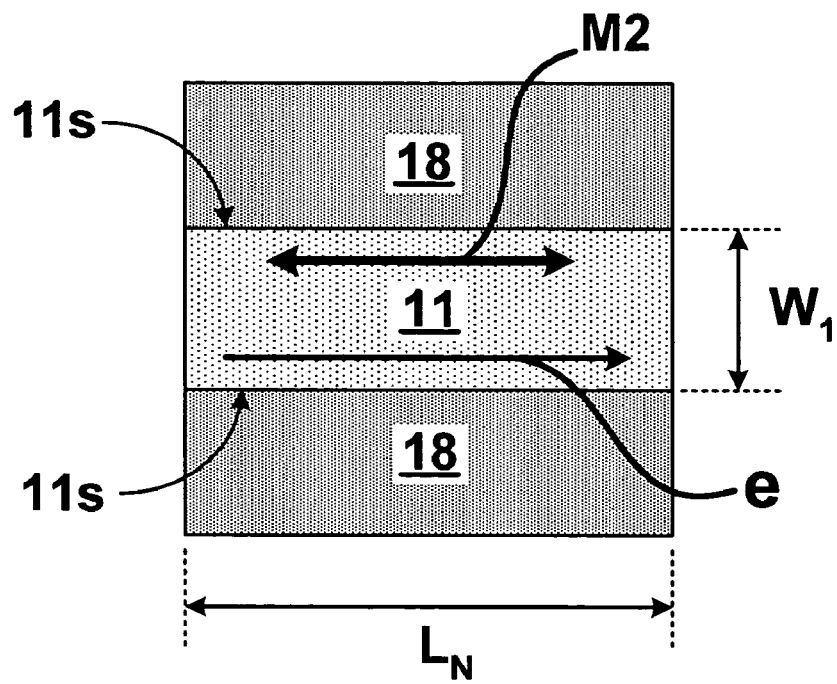

In FIGS. 4 and 8c, a thermally written magnetic memory device 100 includes a plurality of first electrodes 19, a plurality of second electrodes 17, and a plurality of thermally written tunnel junction devices 10. Each of the thermally written tunnel junction devices 10 includes a reference layer 15 in electrical communication with one of the first electrodes and including a pinned orientation of magnetization M1 and a data layer 11 in electrical communication with one of the second electrodes 17 and including an alterable orientation of magnetization M2 for storing a data. A spacer layer 13 is in contact with the data layer 11 and the reference layer 15.

The data layer 11 of each of the thermally written tunnel junction devices 10 includes a width dimension $W_1$ that is smaller than a length dimension $L_N$ so that a shape anisotropy of the data layer 11 is sufficiently large enough to make the data layer super-paramagnetically stable at the read temperature $t_R$ and the alterable orientation of magnetization M2 is substantially aligned with an easy axis e of the data layer 11 (i.e. M2 is substantially parallel to the easy axis e). Consequently, data written to the data layer 11 at the write temperature $t_W$ can be read from the data layer 11 at the read temperature $t_R$ and the data is non-volatile at the read temperature $t_R$.

Figures 8D, 9:
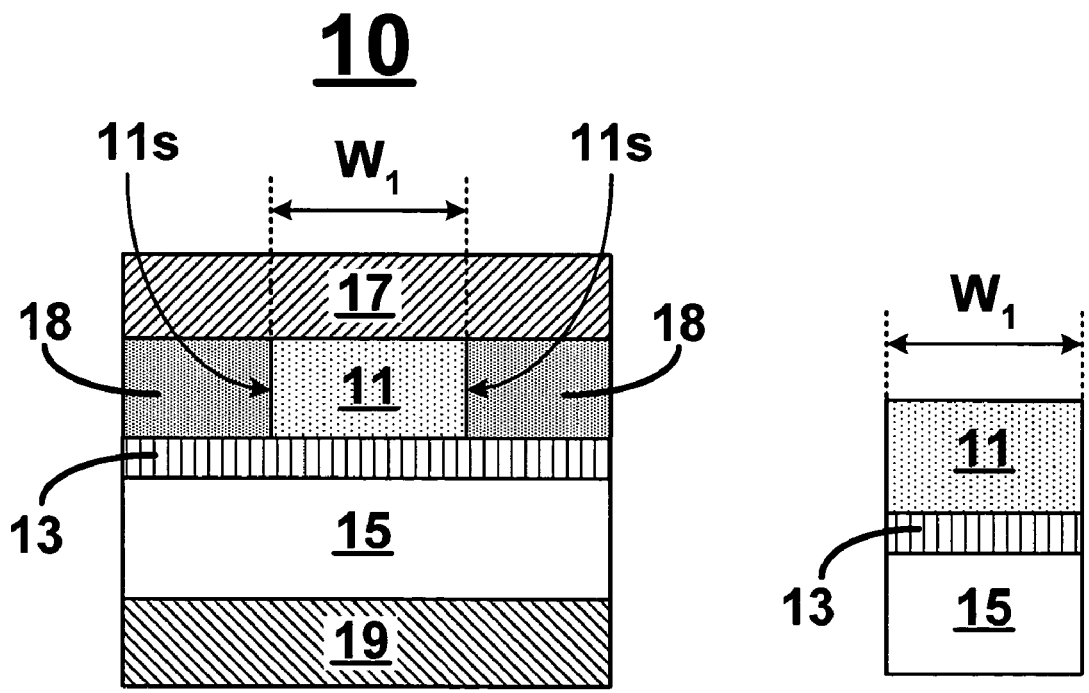
FIG. 8d is a cross-sectional view depicting a data layer including a reduced width dimension to increase a shape anisotropy of the data layer.
FIG. 9 is a cross-sectional view depicting a reduced width dimension for a data layer, a spacer layer, and a reference layer.

In FIGS. 8c and 8d, a dielectric material 18 can be deposited along side wall surfaces 11s of the data layer 11 and the dielectric material 18 can be flush with a top surface of the data layer 11. Optionally, in FIG. 9, some or all of the layers of material in the tunnel junction stack can have the width dimension $W_1$. For example, the reference layer 15 and the spacer layer 13 can also include the width dimension $W_1$.

Figure 10:
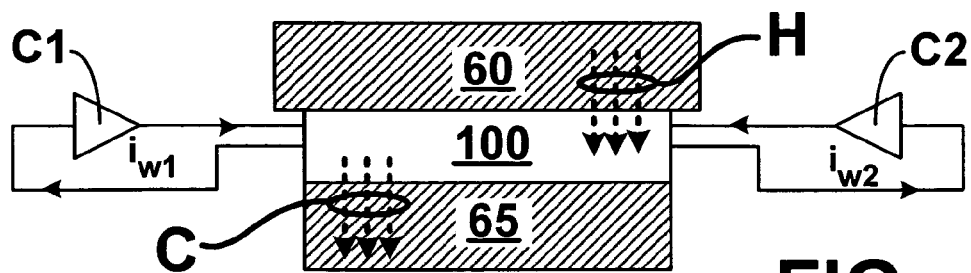
FIG. 10 is a cross-sectional view depicting a heat source for heating a thermally written magnetic memory device to a write temperature and a cooling source for cooling the thermally written magnetic memory device to a read temperature.

In FIG. 10, the thermally written magnetic memory device 100 can include a heat source 60 for heating H the data layers 11 to the write temperature $t_W$ so that data can be written to a selected one or more of the data layers 11 during a write operation (i.e. in the Write Data region of FIGS. 3a and 3b where the coercivity $H_C$ of the data layers 11 is at the low coercivity). The heat source 60 can be in contact with the thermally written magnetic memory device 100 or positioned in proximity to, or in thermal communication with, the thermally written magnetic memory device 100 so that the heat H generated is thermally communicated to the data layers 11. Current sources C1 and C2 can supply the write currents ($i_{W1}$, $i_{W2}$) respectively when the device 100 has been heated to the write temperature $t_W$. Examples of heat sources include resistive heaters, inductive heaters, and radiant (light based) heaters.

The thermally written magnetic memory device 100 can also include a cooling source 65 for cooling C the data layers 11 down to the read temperature $t_R$ (i.e. in the Read Data region of FIGS. 3a and 3b where the coercivity $H_C$ of the data layers 11 is at the high coercivity). Examples of suitable cooling sources 65 include but are not limited to a thermoelectric cooler, a heat sink, a heat pipe, a fan assisted heat sink, a fan, or some other type heat transfer device. The cooling source 65 can be in contact with the thermally written magnetic memory device 100, positioned in proximity to, or in thermal communication with, the thermally written magnetic memory device 100 so that the heat H is thermally communicated away from the data layers 11 by the cooling source 65.

Figure 11:
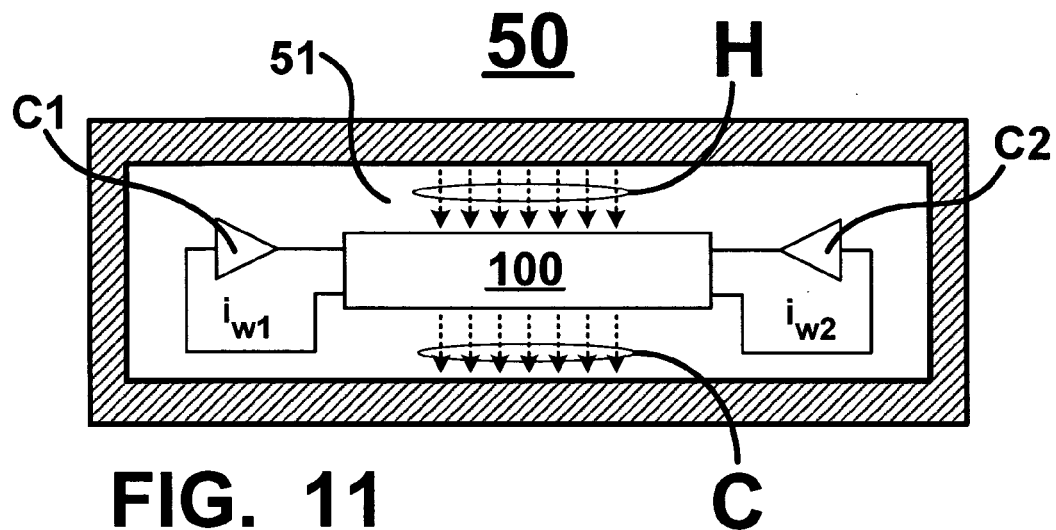
FIG. 11 is a cross-sectional view depicting a temperature control unit for heating and/or cooling a thermally written magnetic memory device.

In FIG. 11, the thermally written magnetic memory device 100 can be placed in a temperature control unit 50 that includes a heat source for heating H the data layers 11 to the write temperature $t_W$. The temperature control unit 50 can also include a cooling source for cooling C the data layers 11 to the read temperature $t_R$. Current sources C1 and C2 can supply the write currents as described above. The heat source and the cooling source can be like those described in reference to FIG. 10 above.

Figure 12:
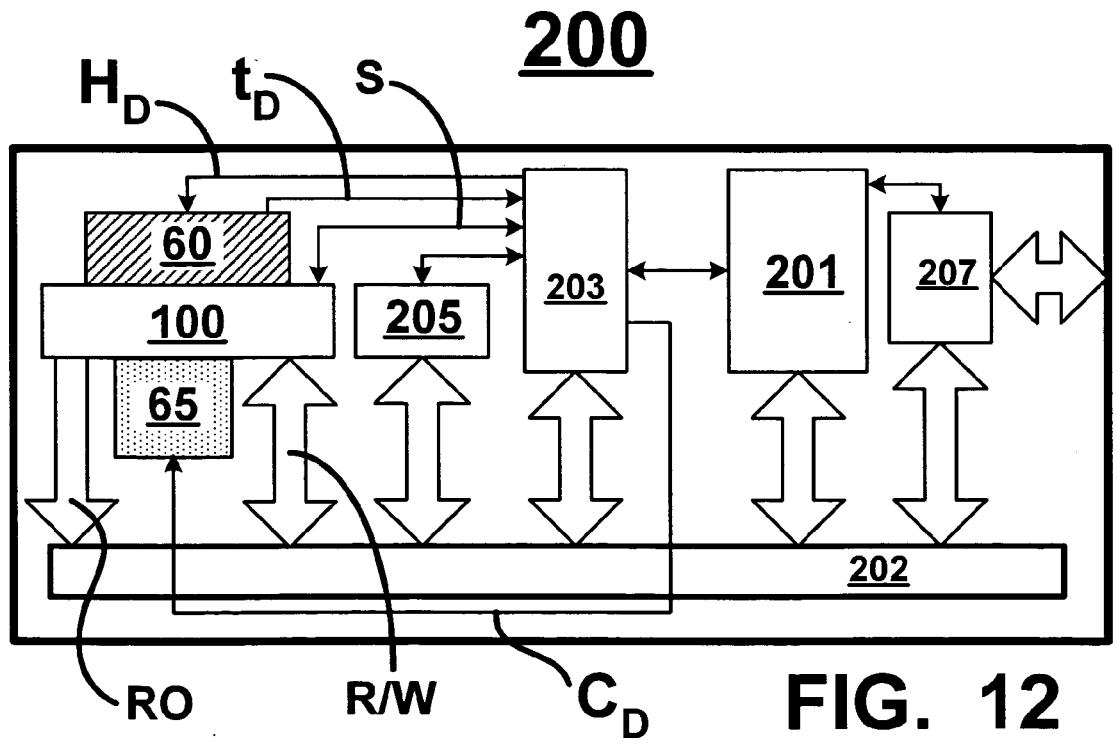
FIG. 12 is a block diagram depicting a system in electrical communication with a thermally written magnetic memory device.

In FIG. 12, a system 200 includes the thermally written magnetic memory device 100 and the system 200 can read, write, or read and write data to the device 100. The system 200 can be an electronic system, such as a computer, for example. As one example, the system 200 can include: a CPU 201; one or more data storage devices 205 (e.g. DRAM, SRAM, hard disc drives); a memory control unit 203; an I/O unit 207; and a data bus 202 for communicating data between the various units. The device 100 can be pre-written with data so that it serves as a read-only-memory (ROM) and data can be read from the device 100 as depicted by the RO arrow to the data bus 202. The system 200 can include a heat source 60 for heating the device 100 to the write temperature $t_W$ so that data can be written to the device 100. The system 200 can also include a cooling source 65 for cooling the device 100 to the read temperature $t_R$. The memory control unit 203 can control the device 100 via signal lines S and can heat the device 100 via a signal line $H_D$.

Similarly a cooling signal $C_D$ can be used to initiate cooling by the cooling source 65. Another signal $t_D$ can be used to sense a temperature of the device 100 to determine whether or not the device 100 has been heated to the write temperature $t_W$ or cooled to the read temperature $t_R$. For example, a thermocouple, a thermistor, or a solid state temperature sensor can provide the signal $t_D$. When the heat source 60 is used, data can be written to the device 100 during a write operation. Subsequently, after the device 100 has cooled to the read temperature $t_R$ (either naturally or via the cooling source 65) data can be read as indicated by the read-write arrow R/W.

Depending on the application the system 200 is designed for, it may be desirable to only read, write, or both read and write data to/from the device 100. Accordingly, the inclusion of the above mentioned heating and cooling sources (60, 65) in the system 200 may be determined by how the system uses the device 100. For example, if the system 200 is a global positioning system (GPS) and the device 100 includes geographic data (e.g map data), then the system 200 may only need to read data from the device 100. As another example, if the system 200 is designed to record information (e.g audio or video data), then the system 200 may only need to write data to the device 100. As a final example, if the system 200 is a computing device, then the system 200 may need to read data from and write data to the device 100.

Figure 13:
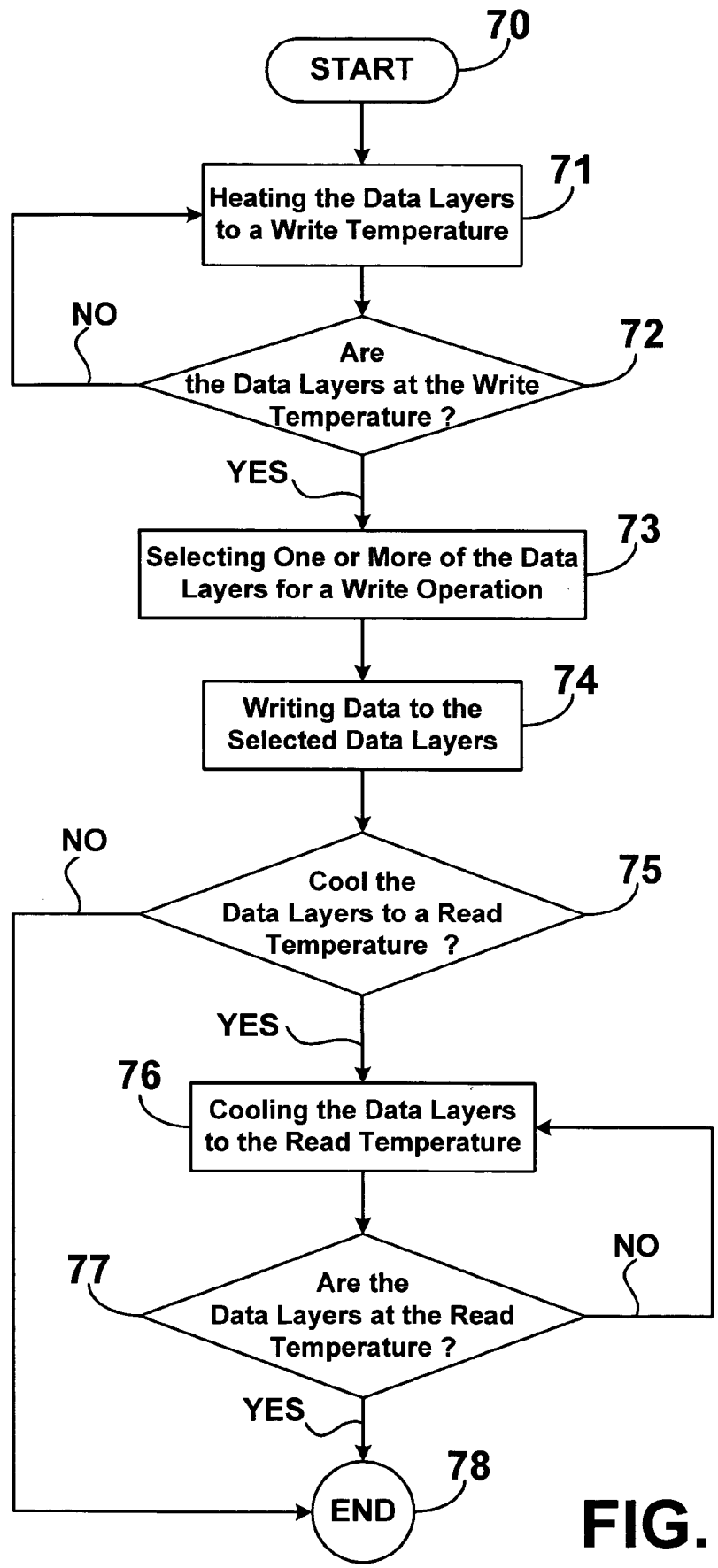
FIG. 13 is a flow diagram depicting a method of writing data to a thermally written magnetic memory device.

In FIG. 13, a method 70 of writing data to a thermally written magnetic memory device 100 includes at a stage 71, heating H the data layers 11 to a write temperature $t_W$. At a stage 72, a determination is made as to whether or not the data layers 11 have reached the write temperature $t_W$. If the data layers 11 have not reached the write temperature $t_W$, then the heating H at the stage 71 is continued until the write temperature $t_W$ is reached. At a stage 73, one or more of the data layers 11 are selected for a write operation as was described above. At a stage 74, data is written to the selected data layers 11. The stage 74 can include writing data in large units such as bytes or words, for example. At a stage 75, if a cooling C of the data layers 11 to a read temperature $t_R$ is not desired, then the method 70 terminates at a stage 78. On the other hand, if at the stage 75 a cooling C of the data layers 11 to the read temperature $t_R$ is desired, then at a stage 76, the data layers 11 are cooled to the read temperature $t_R$. At a stage 77, a determination is made as to whether or not the data layers 11 have reached the read temperature $t_R$. If the data layers 11 have not reached the read temperature $t_R$, then the cooling at the stage 76 is continued until the read temperature $t_R$ is reached.

Although several embodiments of the present invention have been disclosed and illustrated, the invention is not limited to the specific forms or arrangements of parts so described and illustrated. The invention is only limited by the claims.

What is claimed is:

1. A thermally written magnetic memory device, comprising:
a plurality of first electrodes; a plurality of second electrodes; and a plurality of thermally written tunnel junction devices, each thermally written tunnel junction device including a reference layer in electrical communication with one of the first electrodes and including a pinned orientation of magnetization,
a data layer in electrical communication with one of the second electrodes and including an alterable orientation of magnetization for storing a data,
the data layer including a width dimension of the data layer that is smaller than a length dimension of the data layer so that a shape anisotropy of the data layer is sufficiently large enough to make the data layer superparamagnetically stable at a read temperature, the data layer has a high coercivity at a read temperature and the data is non-volatile at the read temperature, and
the data layer has a low coercivity at a write temperature that is higher than the read temperature and the data can be written to the data layer at the write temperature, and
a spacer layer in contact with the data layer and the reference layer.

2. The device as set forth in claim 1 and further comprising:
a heat source for heating the data layers of the plurality of thermally written tunnel junction devices to the write temperature so that the data can be written to a selected one or more of the data layers.

3. The device as set forth in claim 2 and further comprising:
a cooling source for cooling the data layers of the plurality of thermally written tunnel junction devices to the read temperature so that the data stored in the data layers is non-volatile at the read temperature.

4. The device as set forth in claim 1, wherein the read temperature is less than about 125.degree. C.

5. The device as set forth in claim 4, wherein the read temperature is in a range from about 20.degree. C. to about 80.degree. C.

6. The device as set forth in claim 1, wherein the write temperature is in a range from about 200.degree. C. to about 240.degree. C.

7. The device as set forth in claim 1, wherein the width dimension is smaller than the length dimension by a factor from about 0.2 times smaller than the length dimension to about 0.5 times smaller than the length dimension.

8. The device as set forth in claim 1, wherein a layer selected from the group consisting of the reference layer, the spacer layer, and the reference layer and the spacer layer has a length that is substantially equal to the length dimension of the data layer and a width that is substantially equal to the width dimension of the data layer.

9. A thermally written magnetic memory device, comprising:
a plurality of first electrodes; a plurality of second electrodes; and
a plurality of thermally written tunnel junction devices, each thermally written tunnel junction device including a reference layer in electrical communication with one of the first electrodes and including a pinned orientation of magnetization,
a data layer in electrical communication with one of the second electrodes and including an alterable orientation of magnetization for storing a data,
the data layer including a thickness selected to make a magnetic volume of the data layer sufficiently large enough so that the data layer is super-paramagnetically stable at a read temperature,
the data layer has a high coercivity at the read temperature and the data is non-volatile at the read temperature, and
the data layer has a low coercivity at a write temperature that is higher than the read temperature and the data can be written to the data layer at the write temperature, and a spacer layer in contact with the data layer and the reference layer.

10. The device as set forth in claim 9, wherein the thickness of the data layer is in a range from about 8.0 nanometers to about 40 nanometers.

11. The device as set forth in claim 9 and further comprising:

a heat source for heating the data layers of the plurality of thermally written tunnel junction devices to the write temperature so that the data can be written to a selected one or more of the data layers.

12. The device as set forth in claim 11 and further comprising:

a cooling source for cooling the data layers of the plurality of thermally written tunnel junction devices to the read temperature so that the data stored in the data layers non-volatile at the read temperature.

13. The device as set forth in claim 9, wherein the read temperature is less than about 125.degree. C.

14. The device as set forth in claim 13, wherein the read temperature is in a range from about 20.degree. C. to about 80.degree. C.

15. The device as set forth in claim 9, wherein the write temperature is in a range from about 200.degree. C. to about 240.degree. C.

* * * * *

UNITED STATES PATENT AND TRADEMARK OFFICE
CERTIFICATE OF CORRECTION

PATENT NO.        : 7,193,259 B2
APPLICATION NO.   : 10/898279
DATED             : March 20, 2007
INVENTOR(S)       : Manoj K. Bhattacharyya et al.

It is certified that error appears in the above-identified patent and that said Letters Patent is hereby corrected as shown below:

In column 2, line 11, delete "area a," and insert -- area $a_1$ --, therefor.

In column 2, line 34, delete "$1_x$" and insert -- $I_x$ --, therefor.

In column 2, line 36, delete "$1_y$" and insert -- $I_y$ --, therefor.

Signed and Sealed this

Tenth Day of March, 2009

JOHN DOLL
*Acting Director of the United States Patent and Trademark Office*